US012795911B2

(12) United States Patent
Wang et al.

(10) Patent No.: US 12,795,911 B2
(45) Date of Patent: Nov. 10, 2026

(54) METHOD FOR MANUFACTURING NOR FLASH

(71) Applicant: Shanghai Huali Integrated Circuit Corporation, Shanghai (CN)

(72) Inventors: Qiwei Wang, Shanghai (CN); Yufei Shu, Shanghai (CN); Shaokang Yao, Shanghai (CN); Zhi Tian, Shanghai (CN); Haoyu Chen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 355 days.

(21) Appl. No.: 18/778,747

(22) Filed: Jul. 19, 2024

(65) Prior Publication Data

US 2025/0142819 A1 May 1, 2025

(30) Foreign Application Priority Data

Oct. 27, 2023 (CN) ......................... 202311413739.0

(51) Int. Cl.
*H10B 41/30* (2023.01)

(52) U.S. Cl.
CPC .................................... *H10B 41/30* (2023.02)

(58) Field of Classification Search
CPC ........ H10B 41/30; H10B 41/35; H10B 41/48; H10W 10/021; H10W 10/20
See application file for complete search history.

(56) References Cited

U.S. PATENT DOCUMENTS

| | | | | |
|---|---|---|---|---|
| 6,040,217 A * | 3/2000 | Lin | ........................ | H10B 41/30 438/258 |
| 9,281,314 B1 * | 3/2016 | Kashimura | ............ | H10B 41/35 |
| 2011/0303967 A1 * | 12/2011 | Harari | .................... | H10B 41/30 257/E21.573 |
| 2018/0315765 A1 * | 11/2018 | Lin | ........................ | H10B 41/10 |
| 2020/0105777 A1 * | 4/2020 | Lin | ........................ | H10B 41/10 |
| 2021/0376120 A1 * | 12/2021 | Chen | ...................... | H10B 41/30 |
| 2023/0005863 A1 * | 1/2023 | Yang | ...................... | H10B 43/20 |
| 2024/0147718 A1 * | 5/2024 | Lin | ........................ | H10B 41/40 |
| 2025/0063723 A1 * | 2/2025 | Tang | ...................... | H10B 12/05 |
| 2025/0081447 A1 * | 3/2025 | Sun | ........................ | G11C 5/063 |
| 2025/0329542 A1 * | 10/2025 | Lin | ........................ | H10B 41/30 |

FOREIGN PATENT DOCUMENTS

CN 119233637 A * 12/2024 ............. H10B 41/30

* cited by examiner

*Primary Examiner* — Mamadou L Diallo
(74) *Attorney, Agent, or Firm* — Quarles & Brady LLP

(57) ABSTRACT

The present disclosure discloses a method for manufacturing a NOR flash. The drain area groove and the peripheral isolation grooves are first formed and filled with the trench isolation oxide, followed by the formation of the source area groove, and then the SiH4 layer is deposited. Due to the poor filling property of SiH4, the air gap may be formed at the source area groove with a small gap, and at this time, the drain area groove in the drain area of the storage area and the peripheral isolation groove in the logic area both have been filled and thus are unaffected. The method for manufacturing a NOR flash of the present disclosure allows the formation of the source air gap of the NOR flash based on a post-source preparation process and good filling of the drain, reducing the coupling effect between the source polysilicon gates.

15 Claims, 8 Drawing Sheets

METHOD FOR MANUFACTURING NOR FLASH

CROSS-REFERENCE TO RELATED APPLICATIONS

This application claims priority to Chinese patent application No. 202311413739.0, filed on Oct. 27, 2023, the disclosure of which is incorporated herein by reference in its entirety.

TECHNICAL FIELD

The present disclosure relates to semiconductor manufacturing technologies, and in particular, to a method for manufacturing a NOR flash.

BACKGROUND

NOR erasable programmable read only memory with tunnel oxide or EPROM with tunnel oxide (ETOX) flash memory (hereinafter referred to as NOR flash) is a non-volatile flash with a high read speed, high reliability, and intra-chip execution capability, and has become one of the most widely applied non-volatile memories currently. With the advancement of manufacturing technologies and increased market demand for high-capacity, high-density and low-power NOR flashes, the NOR flash has transitioned from the 65/55 nm node of mass production to the 40 nm+ node of research and development and mass production. The source polysilicon gate gap of NOR flashes at smaller technology nodes is further reduced compared with the 65/55 nm NOR flash, and the coupling effect between polysilicon gates continues to be enhanced, affecting the performance and reliability. During the research and development of NOR flashes at smaller nodes, the development of new process flows is required to weaken the coupling effect, so as to improve the device performance and reliability.

An effective way to weaken the coupling effect of polysilicon gates on both sides of the source is to use a filler dielectric with a lower dielectric constant. Among optional filler dielectrics, air has a very low dielectric constant. As reference, silicon dioxide, the most commonly used filler material, has a relative dielectric constant of about 3.9, while air has a relative dielectric constant of about 1. Therefore, replacing the existing silicon dioxide with the air gap, as the filler material between the polysilicon gates at the source, can significantly weaken the coupling effect.

On the other hand, the NOR flash has a large space at the drain, and the coupling effect of polysilicon gates on both sides of the drain is very weak, having negligible impacts on the performance and reliability. However, unlike the structure in which multiple sources share one single pickup, each bit of the NOR flash necessarily has an individual drain pickup. Considering the subsequent contact process of the drain pickup, good filling of the drain is required, in which case the air gap process cannot be used.

BRIEF SUMMARY

The method for manufacturing a NOR flash provided by the present disclosure includes the following steps:

S1: providing a semiconductor substrate 100 divided into a storage area A and a logic area B, the storage area A including a source area AA and a drain area AB;

S2: forming a gate oxide layer 210 on a surface of the semiconductor substrate 100, forming a gate structure

220 on the gate oxide layer 210 located in the storage area A, and forming a peripheral polysilicon layer 230 on the gate oxide layer 210 located in the logic area B, where the gate structure 220 includes a floating gate polysilicon layer 221, an inter-gate dielectric layer 222, and a control gate polysilicon layer 223 that are stacked sequentially from bottom to top;

S3: opening a drain area AB window of the storage area A by lithography;

S4: removing the gate structure 220 of the drain area AB by etch to expose the gate oxide layer 210, so as to form a drain area groove 310; and etching the peripheral polysilicon layer 230 to form a peripheral polysilicon gate 230*a*, with peripheral isolation grooves 320 being formed on both sides of the peripheral polysilicon gate 230*a;*

S5: depositing a barrier silicon nitride layer 820;

S6: depositing a trench isolation oxide 410, the trench isolation oxide 410 fully filling and being higher than the drain area groove 310 and the peripheral isolation grooves 320;

S7: removing the trench isolation oxide 410 on upper surfaces of the peripheral polysilicon gate 230*a* and the gate structure 220 in the source area by chemical mechanical polishing, and stopping at the barrier silicon nitride layer 820;

S8: opening a window in the middle of the gate structure 220 in the source area and a window in a peripheral isolation groove 320 adjacent to the gate structure 220 in the source area by lithography;

S9: exposing the semiconductor substrate 100 in the middle of the gate structure in the source area and the semiconductor substrate 100 at the peripheral isolation groove 320 adjacent to the gate structure in the source area by etch, to form a source area groove 330;

S10: removing the photoresist;

S11: forming a source area gate sidewall 701 on a source area groove 330 side of the gate structure in the storage area;

S12: removing the barrier silicon nitride layer 820 on the upper surfaces of the gate structure in the source area and the peripheral polysilicon gate 230*a;*

S13: depositing an SiH4 layer 420; and forming an air gap at the source area groove 330 due to the poor filling property of SiH4;

S14: performing deposition and chemical mechanical polishing of a protective oxide layer 430;

S15: exposing the semiconductor substrate 100 at the center of the drain area groove 310 by lithography and etch, to form a drain area contact 900; and S16: filling the contact 900 with a metal 910.

Optionally, after step S2, a hard mask layer 610, a bottom anti reflection coating 620 are sequentially deposited, followed by step S3; and in step S4, the gate structure 220 in the source area AB is first removed by etch to expose the gate oxide layer 310, so as to form the drain area groove 310, and then the photoresist and the bottom anti reflection coating 620 are removed; the peripheral polysilicon layer 230 is etched to form the peripheral polysilicon gate 230*a*, with the peripheral isolation grooves 320 being formed on both sides of the peripheral polysilicon gate 230*a*, and then the hard mask layer 610 is removed.

Optionally, after step S4, a source-drain area and a logic area sidewall 700 are first formed on both sides of the gate structure in the storage area A and on both sides of the peripheral polysilicon gate 230*a*, followed by step S5.

Optionally, after step S4, the source-drain area and the logic region sidewall 700 are first formed on both sides of the gate structure in the storage area A and on both sides of the peripheral polysilicon gate 230*a*, and then a metal silicide is formed on an upper end of the gate structure in the storage area A and on an upper end of the peripheral polysilicon gate 230*a*, followed by step S5.

Optionally, after step S12, a metal silicide 810 is formed on an upper end of the gate structure in the storage area and on an upper end of the peripheral polysilicon gate 230*a*, followed by step S13.

Optionally, in S12, pre-bake and dry etch are performed to remove an oxide and a nitride on the polysilicon gate individually, so as to expose polysilicon.

Optionally, in step S9, self-align source etch is performed to expose the semiconductor substrate 100 in the middle of the gate structure in the source area and the semiconductor substrate 100 of the gate structure in the source area that is close to the peripheral isolation groove, so as to form the source area groove 330.

Optionally, in step S9, surface O2 treatment is first performed to increase adhesion of the photoresist, followed by etch.

Optionally, in step S9, after the source area groove 330 is formed, ion implantation is performed on the semiconductor substrate 100 at the source area groove 330 to form a source pickup.

Optionally, in step S6, the trench isolation oxide 410 is deposited using an HDP chemical vapor deposition process;

in step S11, the source area gate sidewall 701 is deposited using an ALD process;

the thickness of the source area gate sidewall 701 is 100 Å-200 Å; and in step S14, the protective oxide layer 430 is formed by means of plasma-enhanced chemical vapor deposition.

Optionally, after step S15, Ti/TiN is deposited on the surface of the semiconductor substrate 100 at the bottom of the drain area contact 900, and a thermal process is performed to form a TiSi structure, followed by step S16.

Optionally, the thickness of the Ti/TiN deposited on the surface of the semiconductor substrate 100 at the bottom of the drain area contact 900 is 50 Å-00 Å, and an annealing temperature of the subsequent thermal process is 500° C.-600° C.

Optionally, 4h1<h2, h1 being the thickness of the barrier silicon nitride layer 820, and h2 being the width of the drain area groove 310; and the width of the source area groove 310 is less than 55 nm.

Optionally, in step S16, the contact 900 is filled with metal tungsten and subjected to chemical mechanical polishing.

Optionally, in step S1, a shallow trench isolation is formed on the semiconductor substrate 100; and the inter-gate dielectric layer 222 is composed of a bottom oxide layer 222*a*, an intermediate nitride layer 222*b*, and a top oxide layer 222*c* stacked in sequence.

In the method for manufacturing a NOR flash of the present disclosure, the drain area groove 310 and the peripheral isolation grooves 320 are first formed and filled with the trench isolation oxide 410, followed by the formation of the source area groove 330, and then the SiH4 layer 420 is deposited. Due to the poor filling property of SiH4, the air gap may be formed at the source area groove 330 with a small gap, and at this time, the drain area groove 310 in the drain area AB of the storage area and the peripheral isolation groove 320 in the logic area B both have been filled and thus are unaffected.

The method for manufacturing a NOR flash of the present disclosure allows the formation of the source air gap of the NOR flash based on a post-source preparation process and good filling of the drain, reducing the coupling effect between the source polysilicon gates, thereby weakening the coupling effect between the polysilicon gates on both sides, and improving the performance and reliability of the NOR flash.

BRIEF DESCRIPTION OF THE DRAWINGS

In order to more clearly explain the technical solutions of the present disclosure, the drawings required to be used in the present disclosure will be briefly described below. It is obvious that the drawings described below are merely some embodiments of the present disclosure, and those skilled in the art could also obtain other drawings on the basis of these drawings without the practice of inventive effort.

LIST OF REFERENCE NUMERALS

100: semiconductor substrate; A: storage area; B: logic area; AA: source area; AB: drain area; 210: gate oxide layer; 220: gate structure; 230: peripheral polysilicon layer; 221: floating gate polysilicon layer; 222: inter-gate dielectric layer; 223: control gate polysilicon layer; 230*a*: peripheral polysilicon gate; 310: drain area groove; 320: peripheral isolation groove; 820: barrier silicon nitride layer; 410: trench isolation oxide; 330: source area groove; 701: source area gate sidewall; 420: SiH4 layer; 430: protective oxide layer; 900: drain area contact; 610: hard mask layer; 620: bottom anti reflection coating; 700: source drain area and logic area sidewall; 810: metal silicide; 222*a*: bottom oxide layer; 222*b*: intermediate nitride layer; 222*c*: top oxide layer; 910: metal.

DETAILED DESCRIPTION OF THE DISCLOSURE

The technical solutions in the embodiments of the present disclosure will be clearly and completely described below in conjunction with the drawings. Obviously, the described embodiments are only part of the embodiments of the present disclosure, rather than all of the embodiments. Based on the embodiments in the present disclosure, all other embodiments obtained by those skilled in the art without the practice of inventive effort shall fall into the protection scope of the present disclosure.

The terms such as “first” and “second” used in the present application do not indicate any order, quantity, or importance, but are only used to distinguish different constituent parts. The terms such as “include” or “comprise” mean that the components or objects in front of these terms cover the components or objects listed after the terms and equivalents thereof, but does not exclude other components or objects. The terms such as “connection” or “coupling” are not limited to physical or mechanical connections, but may include electrical connections, whether direct or indirect. The terms such as “upper”, “lower”, “left”, “right”, “front”, and “rear” are only used to represent relative positional relationships, which may be changed accordingly after absolute positions of the described objects are changed.

It should be noted that the embodiments or features in the embodiments of the present disclosure can be combined with each other in the case of no conflicts.

Embodiment I

Figure 1:
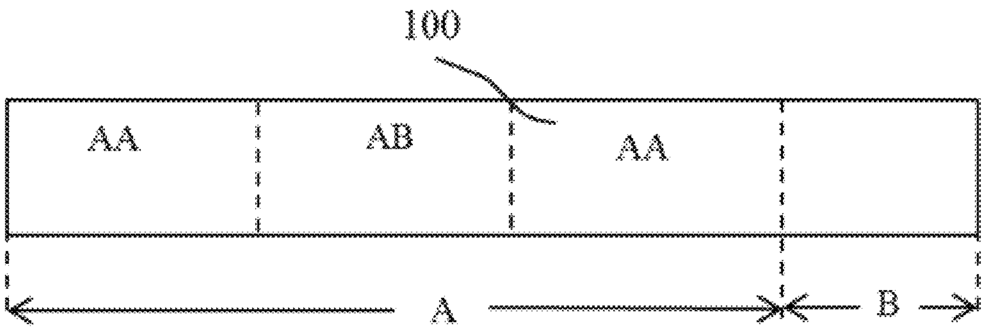
FIG. 1 to FIG. 15 are schematic diagrams of cross-sectional structures formed during a formation process of a method for manufacturing a NOR flash according to an embodiment of the present invention.
Figure 2:
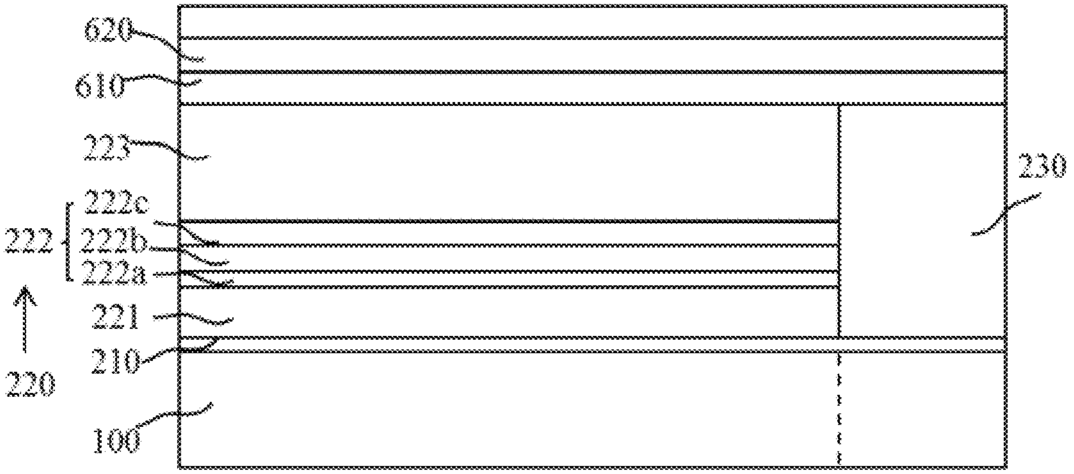
Figure 3:
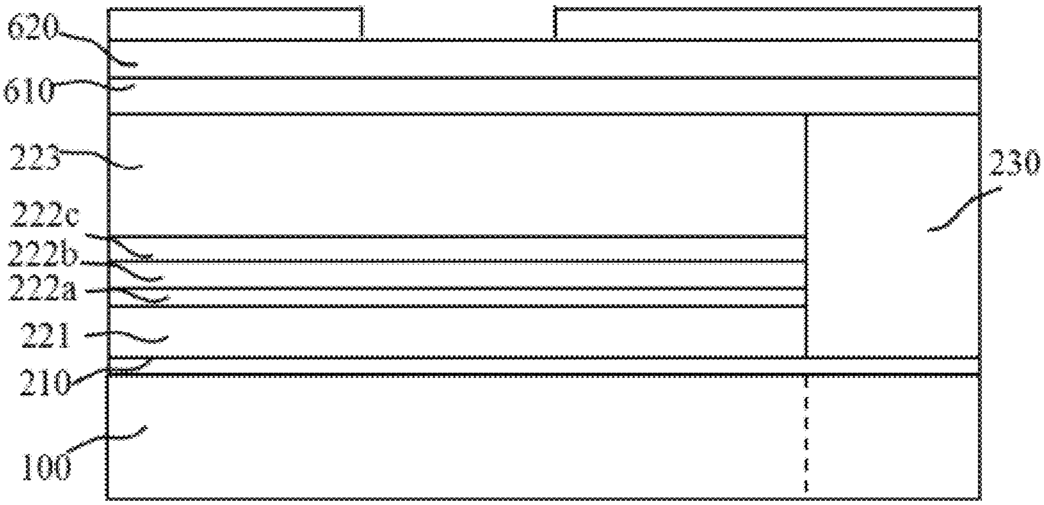
Figure 4:
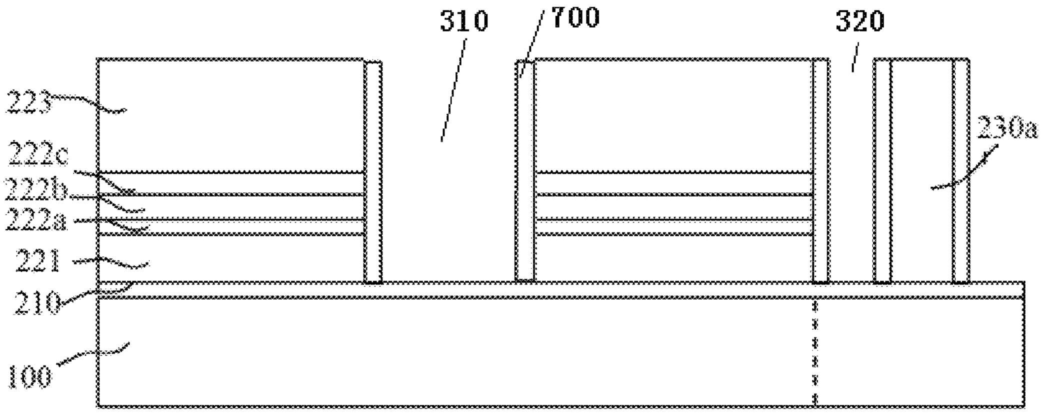
Figure 5:
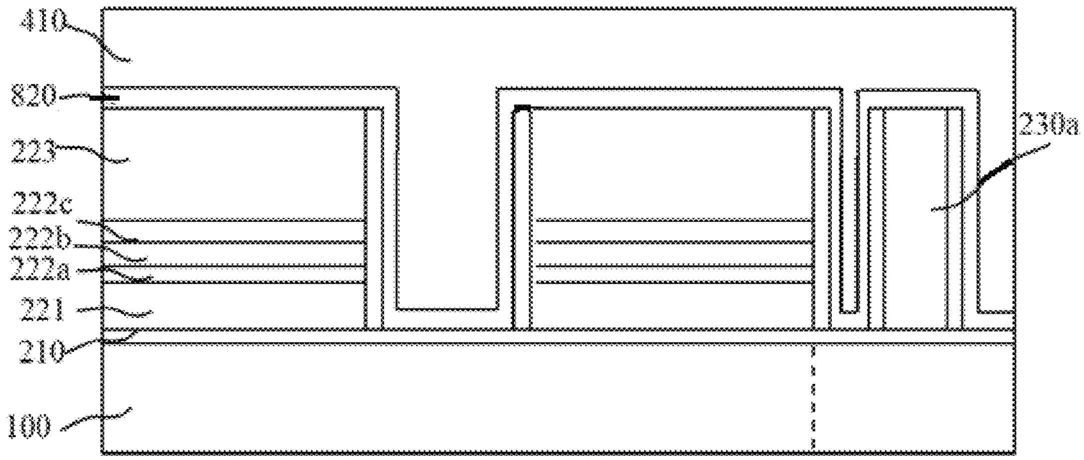
Figure 6:
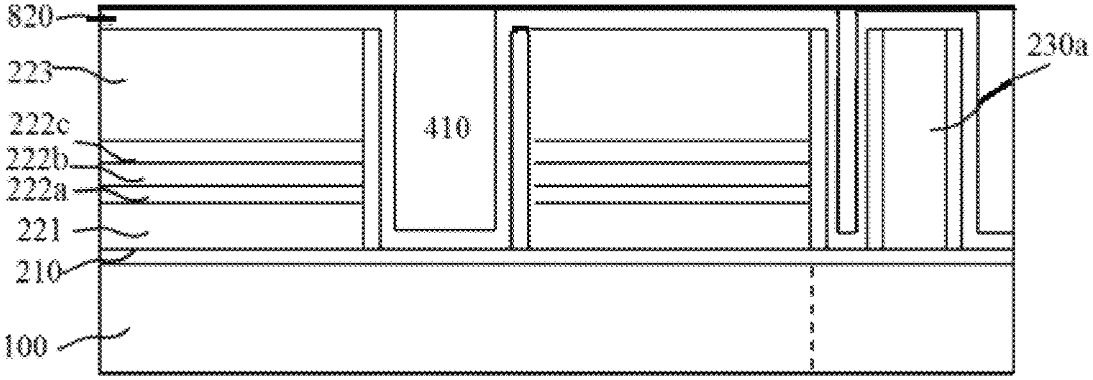
Figure 7:
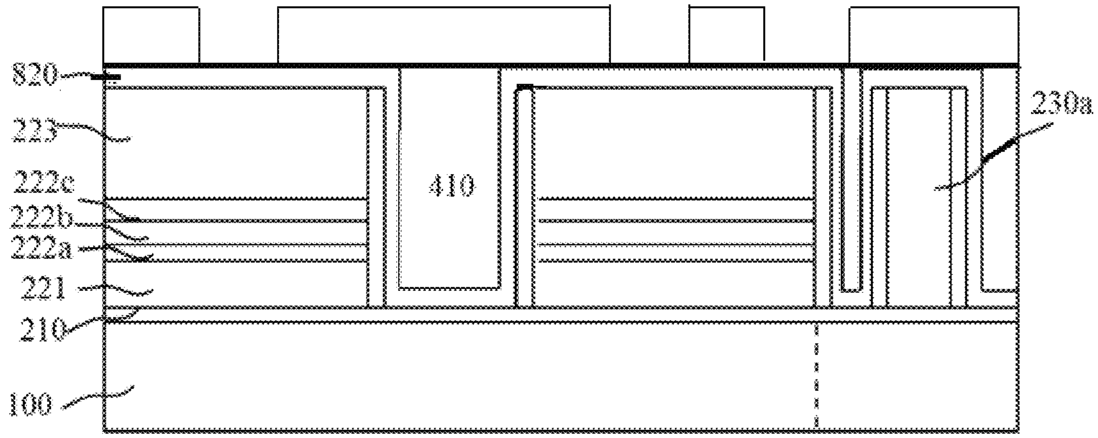
Figure 8:
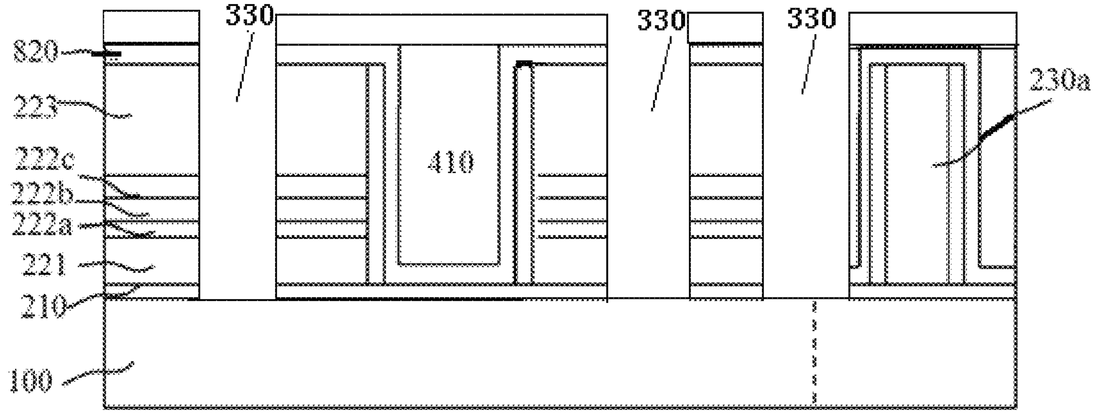
Figure 9:
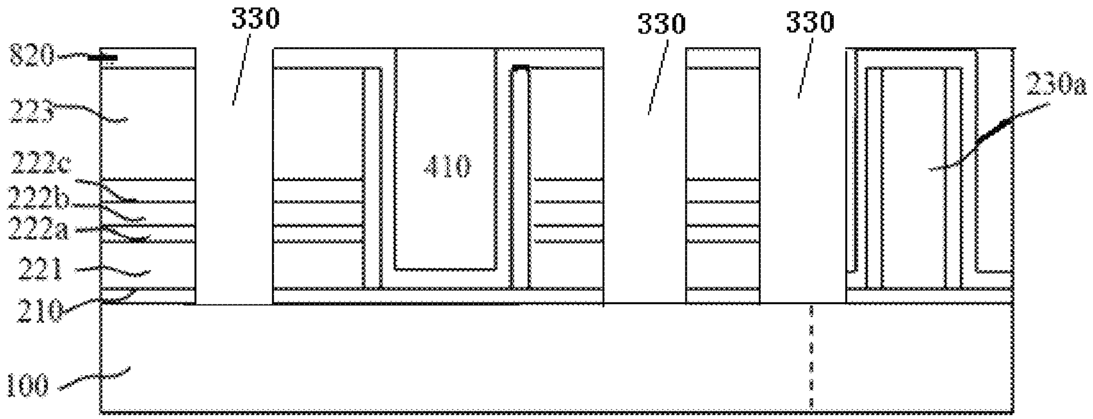
Figure 10:
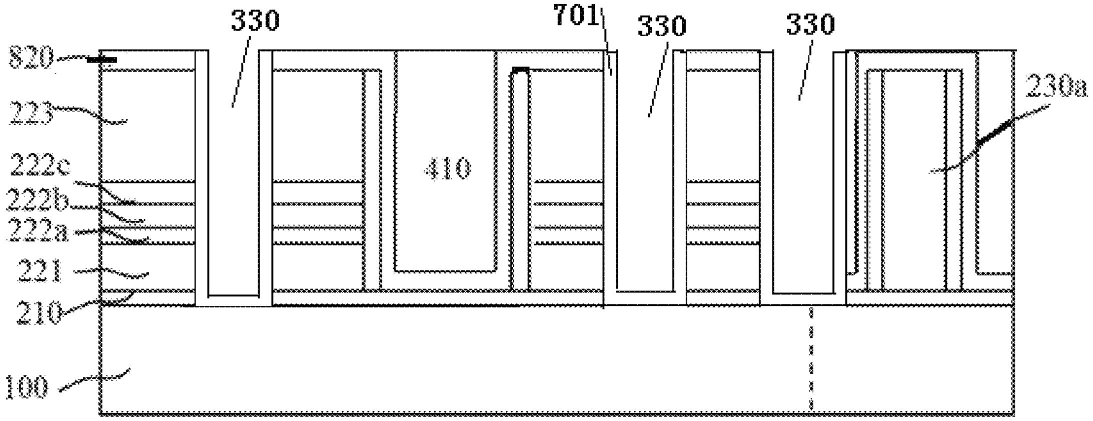
Figure 11:
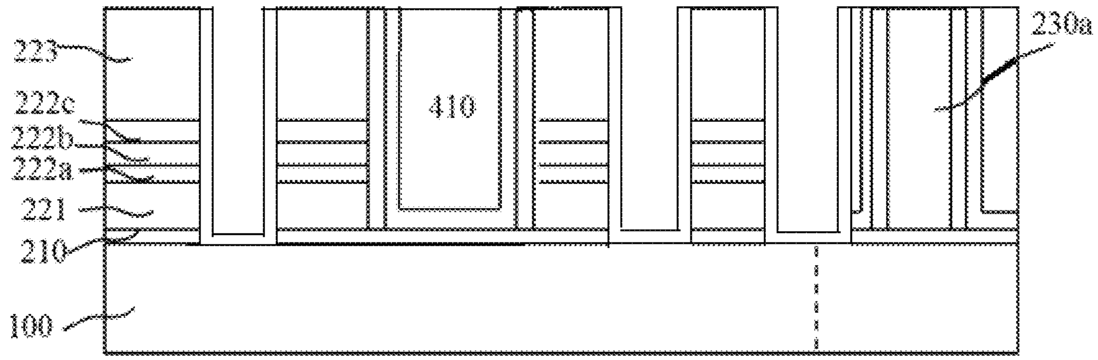
Figure 12:
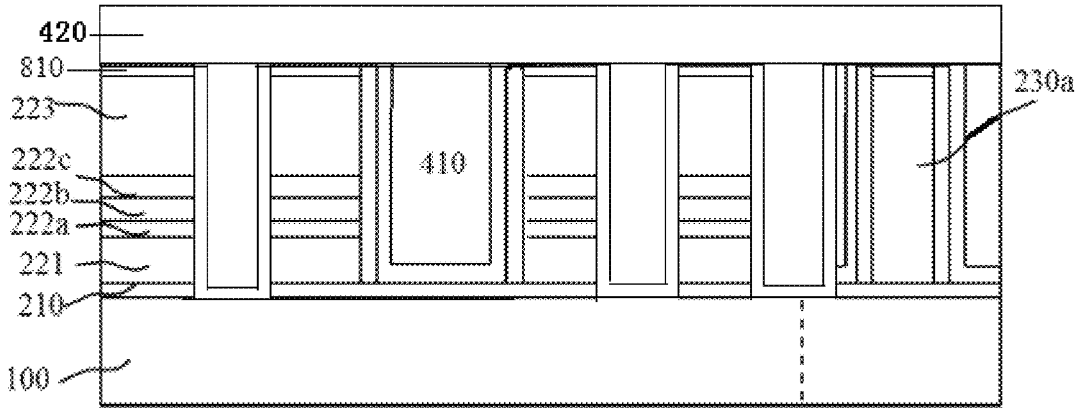
Figure 13:
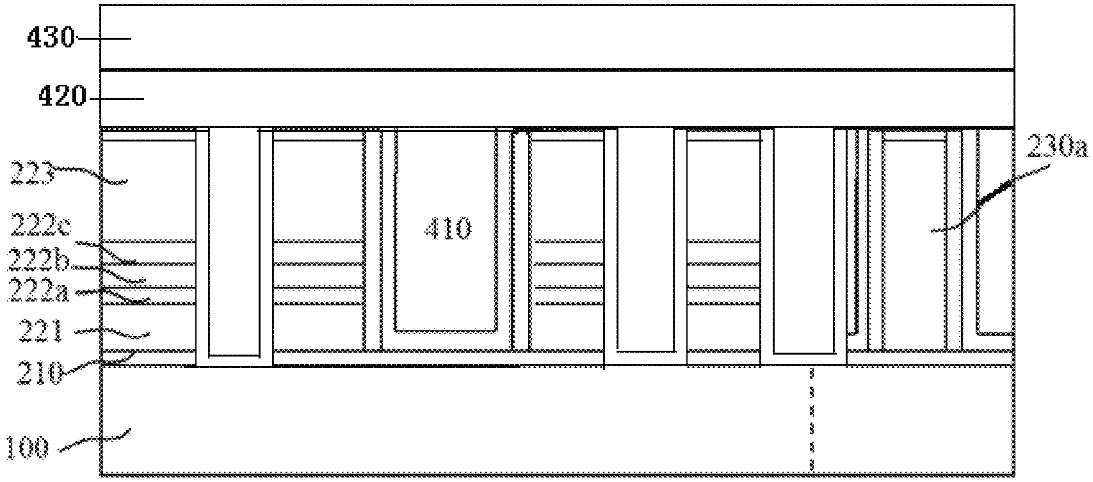
Figure 14:
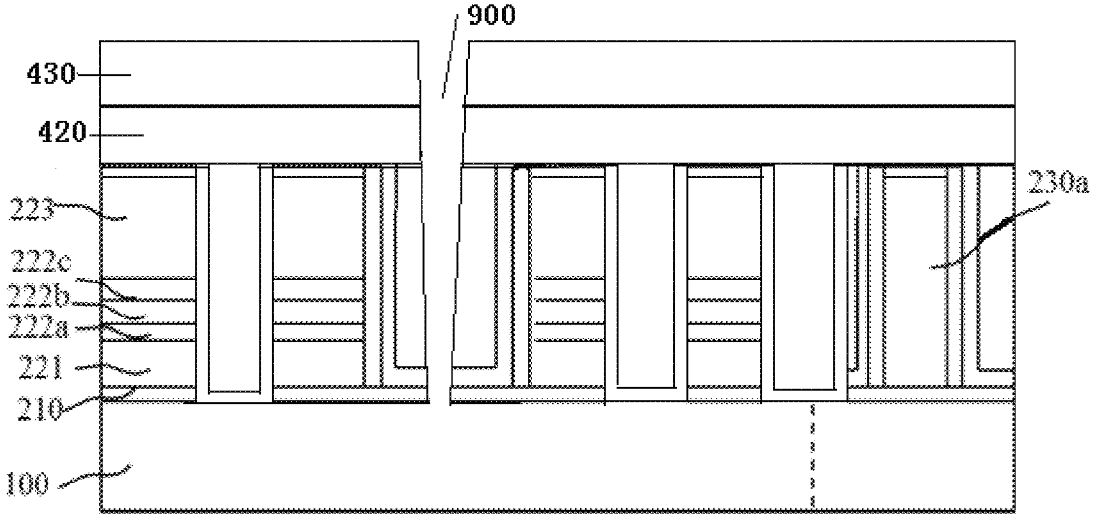
Figure 15:
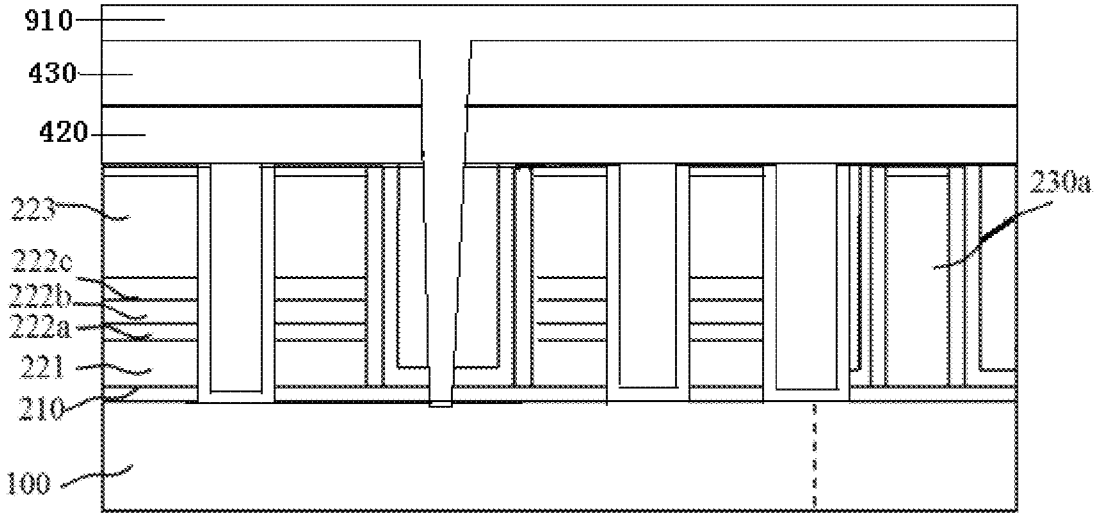

A method for manufacturing a NOR flash includes the following steps:

S1: providing a semiconductor substrate 100 divided into a storage area A and a logic area B, the storage area A including a source area AA and a drain area AB, as shown in FIG. 1;

S2: forming a gate oxide layer 210 on a surface of the semiconductor substrate 100, forming a gate structure 220 on the gate oxide layer 210 located in the storage area A, and forming a peripheral polysilicon layer 230 on the gate oxide layer 210 located in the logic area B, where the gate structure 220 includes a floating gate polysilicon layer 221, an inter-gate dielectric layer 222, and a control gate polysilicon layer 223 that are stacked sequentially from bottom to top, as shown in FIG. 2;

S3: opening a drain area AB window of the storage area A by lithography, as shown in FIG. 3;

S4: removing the gate structure 220 of the drain area AB by etch to expose the gate oxide layer 210, so as to form a drain area groove 310; and etching the peripheral polysilicon layer 230 to form a peripheral polysilicon gate 230*a*, with peripheral isolation grooves 320 being formed on both sides of the peripheral polysilicon gate 230*a*, as shown in FIG. 4;

S5: depositing a barrier silicon nitride layer 820, where the barrier silicon nitride layer 820 deposited earlier is used as a contact etch stop layer (CESL) subsequent;

S6: depositing a trench isolation oxide 410, the trench isolation oxide 410 fully filling and being higher than the drain area groove 310 and the peripheral isolation grooves 320, as shown in FIG. 5;

S7: removing the trench isolation oxide 410 on upper surfaces of the peripheral polysilicon gate 230*a* and the gate structure 220 in the source area by chemical mechanical polishing (CMP), and stopping at the barrier silicon nitride layer 820, as shown in FIG. 6;

S8: opening a window in the middle of the gate structure 220 in the source area and a window in a peripheral isolation groove 320 adjacent to the gate structure 220 in the source area by lithography, as shown in FIG. 7;

S9: exposing the semiconductor substrate 100 in the middle of the gate structure in the source area and the semiconductor substrate 100 at the peripheral isolation groove 320 adjacent to the gate structure in the source area by etch, to form a source area groove 330, as shown in FIG. 8;

S10: removing the photoresist, as shown in FIG. 9;

S11: forming a source area gate sidewall 701 on a source area groove 330 side of the gate structure in the storage area, as shown in FIG. 10;

S12: removing the barrier silicon nitride layer 820 on the upper surfaces of the gate structure in the source area and the peripheral polysilicon gate 230*a*, as shown in FIG. 11;

S13: depositing an SiH4 layer 420; and forming an air gap at the source area groove 330 with a small gap due to the poor filling property of SiH4, as shown in FIG. 12;

S14: performing deposition and chemical mechanical polishing of a protective oxide layer 430, as shown in FIG. 13;

S15: exposing the semiconductor substrate 100 at the center of the drain area groove 310 by lithography and etch, to form a drain area contact 900, as shown in FIG. 14; and S16: filling the contact 900 with a metal 910, as shown in FIG. 15.

In the method for manufacturing a NOR flash of Embodiment I, the drain area groove 310 and the peripheral isolation grooves 320 are first formed and filled with the trench isolation oxide 410, followed by the formation of the source area groove 330, and then the SiH4 layer 420 is deposited. Due to the poor filling property of SiH4, the air gap may be formed at the source area groove 330 with a small gap, and at this time, the drain area groove 310 in the drain area AB of the storage area and the peripheral isolation groove 320 in the logic area B both have been filled and thus are unaffected.

The method for manufacturing a NOR flash of Embodiment I allows the formation of the source air gap of the NOR flash based on a post-source preparation process and good filling of the drain, reducing the coupling effect between the source polysilicon gates, thereby weakening the coupling effect between the polysilicon gates on both sides, and improving the performance and reliability of the NOR flash.

Embodiment II

Based on the method for manufacturing a NOR flash of Embodiment I, after step S2, a hard mask layer 610, a bottom anti reflection coating (BARC) 620 are sequentially deposited, followed by step S3; and in step S4, the gate structure 220 in the source area AB is first removed by etch to expose the gate oxide layer 310, so as to form the drain area groove 310, and then the photoresist and the bottom anti reflection coating (BARC) 620 are removed; the peripheral polysilicon layer 230 is etched to form the peripheral polysilicon gate 230*a*, with the peripheral isolation grooves 320 being formed on both sides of the peripheral polysilicon gate 230*a*, and then the hard mask layer 610 is removed.

In some examples, after step S4, a source-drain area and a logic area sidewall 700 are first formed on both sides of the gate structure in the storage area A and on both sides of the peripheral polysilicon gate 230*a*, followed by step S5.

In some examples, after step S4, the source-drain area and the logic region sidewall 700 are first formed on both sides of the gate structure in the storage area A and on both sides of the peripheral polysilicon gate 230*a*, and then a metal silicide is formed on an upper end of the gate structure in the storage area A and on an upper end of the peripheral polysilicon gate 230*a*, followed by step S5.

Embodiment III

Based on the method for manufacturing a NOR flash of Embodiment I, after step S12, a metal silicide 810 is formed on an upper end of the gate structure in the storage area and on an upper end of the peripheral polysilicon gate 230*a*, followed by step S13.

In some examples, in S12, pre-bake (PREB) and dry etch are performed to remove an oxide and a nitride on the polysilicon gate individually, so as to expose polysilicon, facilitating the formation of the metal silicide.

Embodiment IV

Based on the method for manufacturing a NOR flash of Embodiment I, in step S9, self-align source (SAS) etch is performed to expose the semiconductor substrate 100 in the middle of the gate structure in the source area and the semiconductor substrate 100 of the gate structure in the source area that is close to the peripheral isolation groove, so as to form the source area groove 330.

In some examples, in step S9, surface O2 treatment is first performed, and since there is much surface silicon nitride at this time, to which the adhesion of the photoresist is not good, surface treatment (O2 treatment) thus is required to increase the adhesion of photoresist, followed by etch.

Optionally, in step S9, after the source area groove 330 is formed, ion implantation is performed on the semiconductor substrate 100 at the source area groove 330 to form a source pickup.

In some examples, in step S6, the trench isolation oxide 410 is deposited using a high-density plasma (HDP) chemical vapor deposition process, where the high-density plasma (HDP) chemical vapor deposition process has good filling property.

In some examples, in step S11, the source area gate sidewall 701 is deposited using an atomic layer deposition (ALD) process, where the ALD process has a low temperature and good conformability.

In some examples, the thickness of the source area gate sidewall 701 is 100 Å-200 Å.

In some examples, in step S14, the protective oxide layer 430 is formed by means of plasma-enhanced chemical vapor deposition (PECVD) with tetraethoxysilane (TEOS).

Embodiment V

Based on the method for manufacturing a NOR flash of Embodiment I, after step S15, Ti/TiN is deposited on the surface of the semiconductor substrate 100 at the bottom of the drain area contact 900, and a thermal process is performed to form a TiSi structure, followed by step S16.

In some examples, the thickness of the Ti/TiN deposited on the surface of the semiconductor substrate 100 at the bottom of the drain area contact 900 is 50 Å-00 Å, and an annealing temperature of the subsequent thermal process is 500° C.-600° C.

Since no nickel silicide is formed on a drain of the storage area or on a source or drain of a logic device, after the drain area contact 900 is formed depositing the Ti/TiN and forming the TiSi structure via an appropriate thermal process, with a sidewall of the drain area contact 900 being used as an adhesive layer, may reduce a contact resistance of the drain area contact 900, ensuring the performance of the device.

In some examples, 4h1<h2, h1 being the thickness of the barrier silicon nitride layer 820, and h2 being the width of the drain area groove 310.

In some examples, the width of the source area groove 310 is less than 55 nm.

In some examples, in step S16, the contact 900 is filled with metal tungsten and subjected to chemical mechanical polishing (CMP).

In some examples, in step S1, a shallow trench isolation (STI) is formed on the semiconductor substrate 100.

In some examples, the inter-gate dielectric layer 222 is composed of a bottom oxide layer 222*a*, an intermediate nitride layer 222*b*, and a top oxide layer 222*c* stacked in sequence.

The above descriptions are merely examples of the embodiments of the present disclosure and are not intended to limit the present disclosure. Any modifications, equivalent substitutions, improvements, etc. made within the spirit and principles of the present disclosure shall be included within the protection scope of the present disclosure.

What is claimed is:

1. A method for manufacturing a NOR flash, comprising the following steps:

S1: providing a semiconductor substrate divided into a storage area and a logic area, the storage area comprising a source area and a drain area;

S2: forming a gate oxide layer on a surface of the semiconductor substrate, forming a gate structure on the gate oxide layer located in the storage area A, and forming a peripheral polysilicon layer on the gate oxide layer located in the logic area, wherein the gate structure comprises a floating gate polysilicon layer, an inter-gate dielectric layer, and a control gate polysilicon layer that are stacked sequentially from bottom to top;

S3: opening a drain area window of the storage area by lithography;

S4: removing the gate structure of the drain area by etch to expose the gate oxide layer, so as to form a drain area groove; and etching the peripheral polysilicon layer to form a peripheral polysilicon gate, with peripheral isolation grooves being formed on both sides of the peripheral polysilicon gate;

S5: depositing a barrier silicon nitride layer;

S6: depositing a trench isolation oxide, the trench isolation oxide fully filling and being higher than the drain area groove and the peripheral isolation grooves;

S7: removing the trench isolation oxide on upper surfaces of the peripheral polysilicon gate and the gate structure in the source area by chemical mechanical polishing, and stopping at the barrier silicon nitride layer;

S8: opening a window in the middle of the gate structure in the source area and a window in a peripheral isolation groove adjacent to the gate structure in the source area by lithography;

S9: exposing the semiconductor substrate in the middle of the gate structure in the source area and the semiconductor substrate at the peripheral isolation groove adjacent to the gate structure in the source area by etch, to form a source area groove;

S10: removing the photoresist;

S11: forming a source area gate sidewall on a source area groove side of the gate structure in the storage area;

S12: removing the barrier silicon nitride layer on the upper surfaces of the gate structure in the source area and the peripheral polysilicon gate;

S13: depositing an SiH4 layer; and forming an air gap at the source area groove due to the poor filling property of SiH4;

S14: performing deposition and chemical mechanical polishing of a protective oxide layer;

S15: exposing the semiconductor substrate at the center of the drain area groove by lithography and etch, to form a drain area contact; and S16: filling the contact with a metal.

2. The method for manufacturing a NOR flash according to claim 1, wherein after step S2, a hard mask layer, a bottom anti reflection coating are sequentially deposited, followed by step S3; and in step S4, the gate structure in the source area is first removed by etch to expose the gate oxide layer, so as to form the drain area groove, and then the photoresist and the bottom anti reflection coating are removed; the peripheral polysilicon layer is etched to form the peripheral polysilicon gate, with the peripheral isolation grooves being formed on both sides of the peripheral polysilicon gate, and then the hard mask layer is removed.

3. The method for manufacturing a NOR flash according to claim 1, wherein after step S4, a source-drain area and a logic area sidewall are first formed on both sides of the gate structure in the storage area and on both sides of the peripheral polysilicon gate, followed by step S5.

4. The method for manufacturing a NOR flash according to claim 3, wherein after step S4, the source-drain area and the logic region sidewall are first formed on both sides of the gate structure in the storage area and on both sides of the peripheral polysilicon gate, and then a metal silicide is formed on an upper end of the gate structure in the storage area and on an upper end of the peripheral polysilicon gate, followed by step S5.

5. The method for manufacturing a NOR flash according to claim 1, wherein after step S12, a metal silicide is formed on an upper end of the gate structure in the storage area and on an upper end of the peripheral polysilicon gate, followed by step S13.

6. The method for manufacturing a NOR flash according to claim 5, wherein in S12, pre-bake and dry etch are performed to remove an oxide and a nitride on the polysilicon gate individually, so as to expose polysilicon.

7. The method for manufacturing a NOR flash according to claim 1, wherein in step S9, self-align source etch is performed to expose the semiconductor substrate in the middle of the gate structure in the source area and the semiconductor substrate of the gate structure in the source area that is close to the peripheral isolation groove, so as to form the source area groove.

8. The method for manufacturing a NOR flash according to claim 1, wherein in step S9, surface O2 treatment is first performed to increase adhesion of the photoresist, followed by etch.

9. The method for manufacturing a NOR flash according to claim 1, wherein in step S9, after the source area groove is formed, ion implantation is performed on the semiconductor substrate at the source area groove to form a source pickup.

10. The method for manufacturing a NOR flash according to claim 1, wherein in step S6, the trench isolation oxide is deposited using an HDP chemical vapor deposition process;

in step S11, the source area gate sidewall is deposited using an ALD process; the thickness of the source area gate sidewall is 100 Å-200 Å; and in step S14, the protective oxide layer is formed by means of plasma-enhanced chemical vapor deposition.

11. The method for manufacturing a NOR flash according to claim 1, wherein after step S15, Ti/TiN is deposited on the surface of the semiconductor substrate at the bottom of the drain area contact, and a thermal process is performed to form a TiSi structure, followed by step S16.

12. The method for manufacturing a NOR flash according to claim 11, wherein the thickness of the Ti/TiN deposited on the surface of the semiconductor substrate at the bottom of the drain area contact is 50 Å-00 Å, and an annealing temperature of the subsequent thermal process is 500° C.-600° C.

13. The method for manufacturing a NOR flash according to claim 1, wherein 4h1<h2, h1 being the thickness of the barrier silicon nitride layer, and h2 being the width of the drain area groove; and the width of the source area groove is less than 55 nm.

14. The method for manufacturing a NOR flash according to claim 1, wherein in step S16, the contact is filled with metal tungsten and subjected to chemical mechanical polishing.

15. The method for manufacturing a NOR flash according to claim 1, wherein in step S1, a shallow trench isolation is formed on the semiconductor substrate; and the inter-gate dielectric layer is composed of a bottom oxide layer, an intermediate nitride layer, and a top oxide layer stacked in sequence.

* * * * *